United States Patent [19]

Wallick

[11] 4,044,201
[45] Aug. 23, 1977

[54] LEAD FRAME ASSEMBLY

[75] Inventor: Charles W. Wallick, York, Pa.

[73] Assignee: E. I. Du Pont de Nemours and Company, Wilmington, Del.

[21] Appl. No.: 619,971

[22] Filed: Oct. 6, 1975

Related U.S. Application Data

[62] Division of Ser. No. 506,760, Sept. 17, 1974.

[51] Int. Cl.$^2$ .............................................. H05K 1/04
[52] U.S. Cl. ............................... 174/52 FP; 428/571; 428/573; 428/596
[58] Field of Search .................. 174/52 FP; 29/193.5, 29/589, 591, 628; 317/101 A; 357/70

[56] References Cited

U.S. PATENT DOCUMENTS

| | | | |
|---|---|---|---|
| 3,280,378 | 10/1966 | Brady et al. | 317/101 |
| 3,689,684 | 9/1972 | Cox et al. | 174/68.5 |
| 3,689,991 | 9/1972 | Aird | 29/577 |
| 3,691,629 | 9/1972 | Schierz | 29/588 |
| 3,724,068 | 4/1973 | Galli | 29/471.1 |
| 3,750,252 | 8/1973 | Landman | 29/191.6 |
| 3,793,714 | 2/1974 | Bylander | 29/589 |
| 3,832,480 | 8/1974 | Bunker | 29/576 S |
| 3,838,984 | 10/1974 | Crane et al. | 29/193.5 |

Primary Examiner—J. V. Truhe
Assistant Examiner—D. A. Tone

[57] ABSTRACT

A lead frame assembly of indefinite length having a pair of spaced parallel carrier strips, collapsible rungs extending between the strips at regular intervals along the length of the assembly and a number of leads extending inwardly from the opposed edges of the strip between the rungs. The rungs are collapsed inwardly to seat the ends of the leads against the sides of circuit modules previously positioned between the ends of the leads. The lead ends are seated in recesses in the circuit modules and are subsequently soldered to metalized surfaces on the modules. Following the bending of the leads, the carrier strips and rungs are cut away.

8 Claims, 10 Drawing Figures

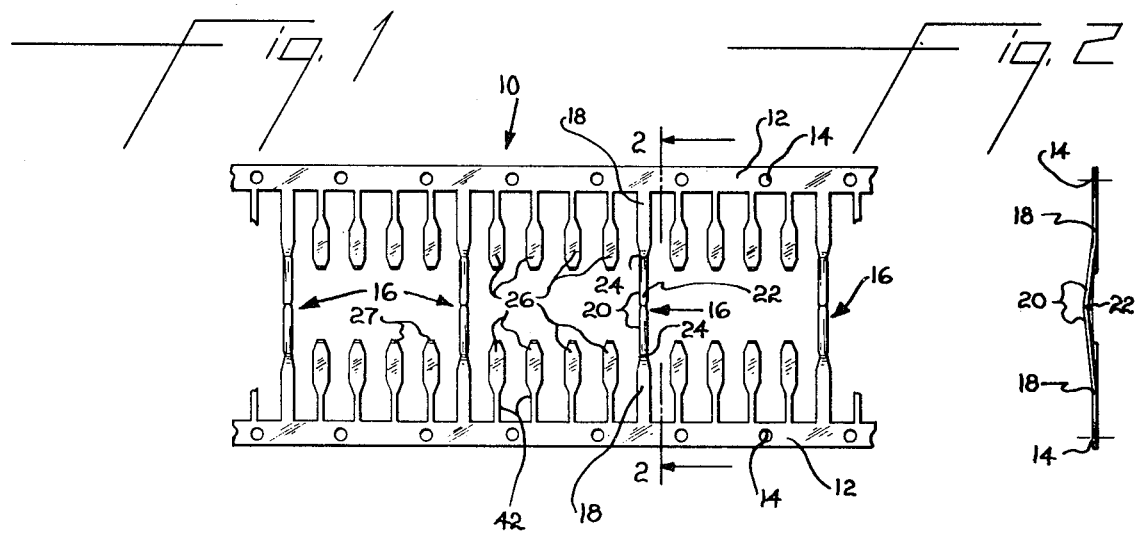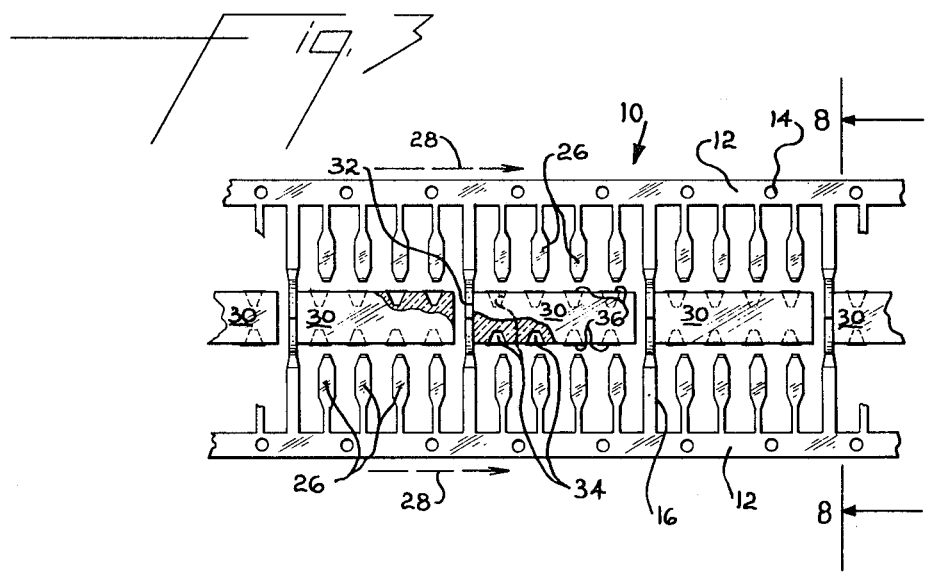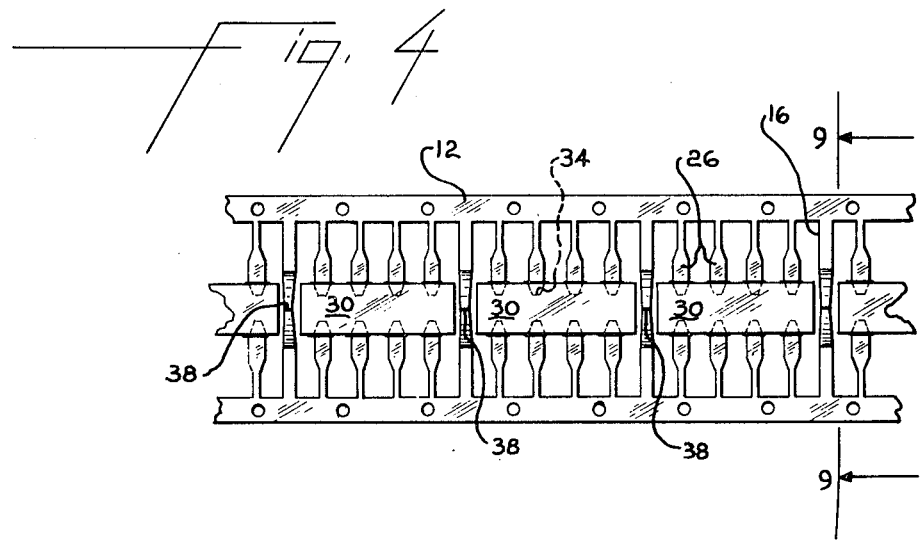

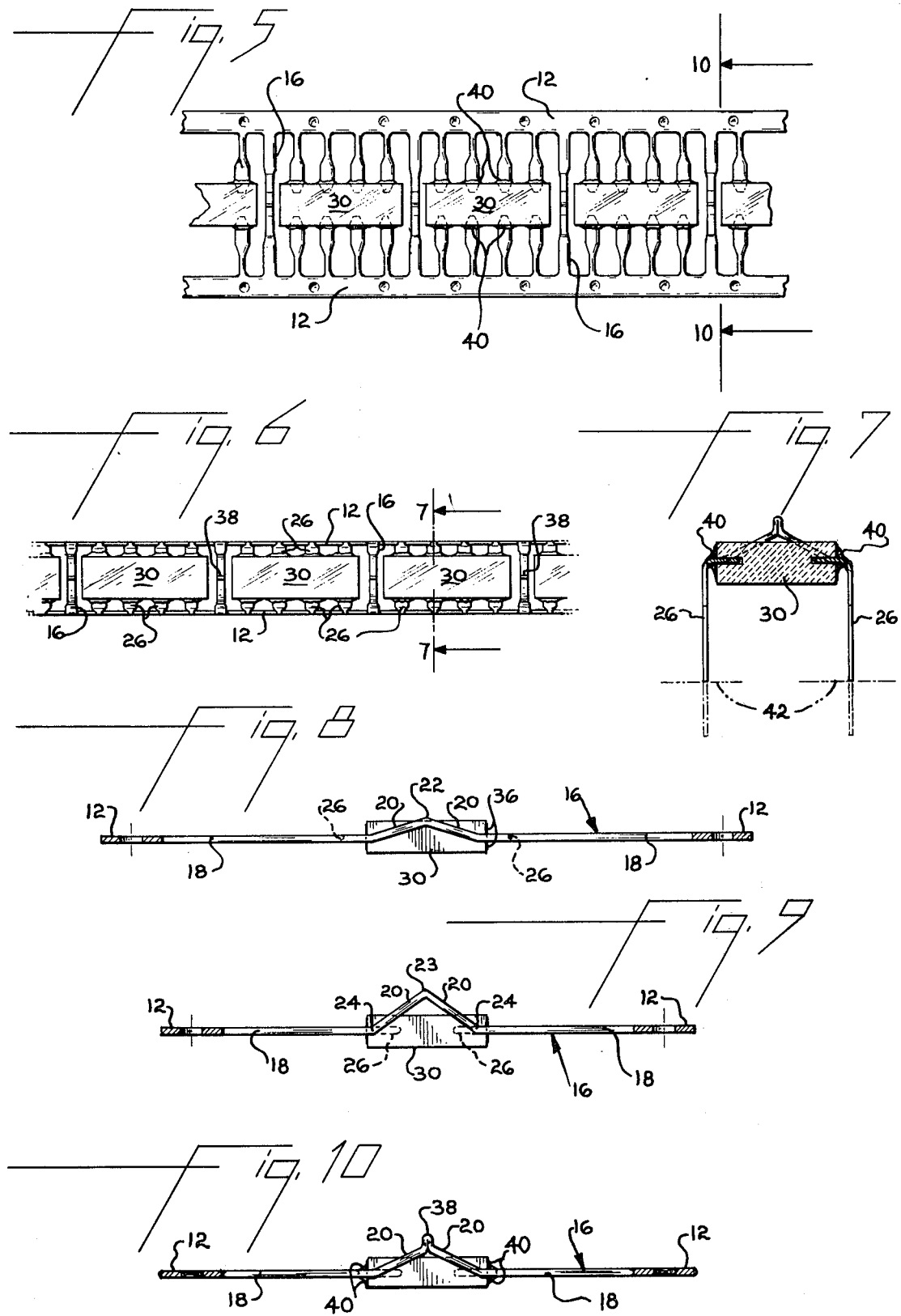

LEAD FRAME ASSEMBLY

This application is a division of my copending application for "Lead Frame Assembly And Method", U.S. Ser. No. 506,760, filed Sept. 17, 1974.

The invention relates to a lead frame assembly for forming dual in-line packages from leadless circuit modules. The lead frame assembly includes a pair of spaced parallel carrier strips with groups of leads extending toward each other from the strips at regular intervals along the length of the strip. Collapsible rungs located between the groups of leads join the strips at intervals along the length of the assembly. Circuit modules having lead-receiving recesses are positioned between the ends of opposed groups of leads on the strips and the rungs are then collapsed to move the ends of the leads into the lead-receiving recesses. With the leads engaging the module, the frame assembly is moved through a soldering operation to form selected electrical connections between the ends of the leads engaging the module and metalized contact pads on the sides of the module adjacent the lead ends. These pads are connected to circuit elements within the module. Subsequently, the leads are collapsed, rungs are bent down to either side of the module, and the leads are severed from the carrier strips to provide individual dual in-line packages, each including a circuit module with a number of leads joining opposed sides of the module and bent 90° so that they all extend in one direction past the sides of the module.

The lead frame permits rapid, continuous, automatic manufacture of dual in-line packages from leadless modules. Heretofore, dual in-line packages have been manufactured form leadless circuit modules by manually positioning the ends of leads on a carrier strip adjacent the metalized pads on the modules and subsequently soldering the lead ends to individual modules. The lead ends are then bent down with respect to the module and the carrier strips are removed. Such a manufacturing operation is slow and expensive and inherently susceptible to manual error. In contrast to the conventional manual manufacture of dual in-line packages, the invention permits reliable automatic, continuous manufacture of the packages at high rates up to about 5,000 packages per hour.

Soldering of leads per se to substrates is well known in the art. Cox et al, U.S. Pat. No. 3,689,684 and Landman U.S. Pat. No. 3,750,252 disclose types of terminals which are clipped on and then soldered to the edge of a relatively thin substrate. Brady et al, U.S. Pat. No. 3,280,378 discloses a specialized solder connection between a lead and one side of a circuit module.

Other objects and features of the invention will become apparent as the description proceeds, especially when taken in conjunction with the accompanying drawings of which there are two sheets.

IN THE DRAWINGS

FIG. 1 is a top view of a lead frame according to the invention;

FIG. 2 is a sectional view taken along line 2—2 of FIG. 1;

FIG. 3 is a view similar to FIG. 1, but showing circuit modules positioned between opposed sets of leads in the assembly;

FIG. 4 is a view similar to FIG. 3, but showing the assembly collapsed with the ends of the leads engaging contact surfaces on the modules;

FIG. 5 is a view similar to FIG. 4 subsequent to soldering;

FIG. 6 is a view similar to FIG. 5 after bending of the leads and rungs of the assembly; and FIGS. 7, 8, 9, and 10 are sectional views taken along lines 7—7, 8—8, 9—9, and 10—10 of FIGS. 6, 3, 4, and 5 respectively.

Lead frame assembly 10 shown in FIGS. 1 and 2 is stampformed from flat sheet metal stock and includes a pair of spaced indefinite length carrier strips 12 having pilot holes 14 formed therein at regular intervals along the length of the strips. Collapsible rungs 16 extend between the spaced strips 12 at regular intervals along the length of the lead frame assembly 10. As illustrated in FIGS. 1 and 2, each collapsible rung 16 includes a pair of relatively rigid arms 18 each extending from one strip 12 toward the other strip and a pair of flat collapsible links 20 joining the ends of the arms 18. The links 20 are bent upwardly through a shallow angle from the arms 18 and join at a shallow apex 22. The width of the rungs 16 is reduced at the junctions 24 between the arms and links and at the apex 22 and the links are narrower than the arms 18.

Leads 26 extend from both carrier strips 12 toward the center of the assembly 10 and are arranged along the length of the carrier strip to form individual opposed groups of leads located between adjacent rungs 16. In the lead frame assembly disclosed herein, there are four leads in each group of leads so that there are a total of eight leads between adjacent rungs. The leads are arranged in the same spacing on both of the carrier strips 12 so that leads on each strip oppose each other. The free ends of leads 26 are reduced in width to provide tapered lead-in surfaces 27 which facilitate positioning the leads against circuit modules prior to soldering.

FIG. 3 illustrates the lead frame assembly 10 as it is moved to the right as indicated by arrows 28. Individual circuit modules 30 have been positioned in the openings between adjacent rungs of the assembly and rest upon a support (not illustrated) so that with movement of the assembly to the right across the surface, the upstream adjacent rung 16 is brought into engagement with the upstream end 32 of each module and carries the module along the support with the assembly 10. If desired, the modules may rest in a shallow groove on the support to assure that the modules are centered between the leads 26. Lead-receiving recesses 34 are provided on the sides of the modules 30 to receive the ends of the leads upon collapsing of the lead frame assembly. The recesses are at the same level as the lead ends. Metalized pads 36 are provided on the sides of the modules adjacent the recesses 34 to form soldered connections with the leads upon collapse of the assembly. These pads are connected to the circuit elements within the module. Modules 30 may include active or passive circuit elements which, in any event, form no part of the present invention.

As the lead frame assembly 10 and modules 30 move to the right as illustrated in FIG. 3, the carrier strips 12 are forced toward each other while held against movement above or below the assembly so that the links 20 are collapsed by bending at the weakened junctions 24 and apex 22 and the ends of the leads 26 are moved toward the modules 30 and seat within the recesses 34. As the ends of the leads first engage the modules, the downstream beveled lead-in surfaces 27 engage the downstream sides of the lead-receiving recesses 34 and move the modules downstream with respect to the strip so that when the lead frame assembly is fully collapsed, the end of each lead is positioned in a recess 34 adjacent one of the metalized pads on one side of the module and the modules no longer rest on rungs 16. This condition is illustrated in FIG. 4.

FIG. 8 illustrates the rung 16 prior to collapse and shows that the ends of the leads 26 are positioned away from the sides of the module. Note the shallow apex 22 defined by links 20. FIG. 9 illustrates the rung 16 following collapse of the lead frame assembly and seating of the lead ends in the recesses in the module. The relatively weak links 20 have been bent up to form a relatively abrupt apex 23 projecting above the top of the module 30. During the collapse of the lead frame assembly, only links 20 are moved to one side of the assembly. The carrier strips 12, arms 18, and leads 26 are all moved inwardly with respect to the assembly or toward the modules in the center of the assembly and are not moved above or below.

Upon collapse of the lead frame assembly, the ends of the links 20 at abrupt apex 23 are crimped together to form a U-shaped crimp connection 38. The crimp connection holds the sides of the collapsed lead frame assembly together and assures that the ends of the leads remain seated in their respective recesses. In this way, the modules 30 are physically secured to the assembly.

Following crimping of the collapsible links 20, the collapsed lead frame assembly, with the modules secured in place on the ends of the leads, is moved through a solder bath so that solder joints 40 are formed between the lead ends and the adjacent metalized pads 36 on the sides of the substrate. In this manner, the leads 26 are connected electrically with circuit paths leading to circuit elements in the modules 30.

After soldering of the leads to the substrates, the carrier strips 12 and the leads are bent down with respect to the modules 30 as illustrated in FIGS. 6 and 7. Rungs 16 are also bent down. The leads and collapsed rungs are then severed from the carrier strips 12 immediately adjacent the strip, allowing the strips and the severed rungs to be removed from the modules with the leads soldered thereto. The carrier strips are severed at lines 44, indicated in FIG. 7. This completes the assembly of the modules and leads into conventional dual in-line packages of the type well known in the art. These packages may be mounted on circuit boards or other components with the leads either soldered to the components or inserted into suitable sockets or the like.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A lead frame assembly comprising a pair of spaced parallel carrier strips, a plurality of spaced leads extending from each carrier strip toward the other strip and arranged in opposed groups along the length of said strip, and collapsible rungs joining said strips between groups of leads, each rung including a pair of collapsible links bent up at a shallow angle from the assembly and joining each other at a shallow apex.

2. A lead frame assembly as in claim 1 wherein the free end of each lead includes a lead-in surface facing an adjacent rung.

3. A lead frame assembly as in claim 1 wherein said apex is centrally located between said strips and each rung also includes an arm portion extending from each strip to the end of one of said links.

4. A lead frame assembly as in claim 3 wherein the width of said links is less than the width of said arms, and the width of the rungs at the apex and the junctions between the links and the arms is reduced.

5. A unitary lead frame assembly formed from flat strip stock comprising a pair of spaced parallel flat carrier strips of indefinite length, each strip having an edge facing the other strip, a plurality of spaced leads extending from said edge of each strip toward the other strip and arranged in opposed groups of leads along the lengths of said strips, and a plurality of collapsible rungs joining said strips between pairs of opposed groups of leads, each rung including a pair of collapsible links joined at an apex between said carrier strips for reducing the spacing between said carrier strips.

6. An assembly for use in the manufacture of dual in-line packages including a pair of spaced parallel strips of indefinite length, a plurality of spaced leads extending from each strip toward the other strip and arranged in opposed groups along the lengths of said strips, a circuit module positioned between the leads of each pair of opposed groups of leads, recesses on the sides of the modules facing the adjacent leads with the ends of the leads extending into said recesses whereby the modules are held with respect to the leads, and a plurality of rungs joining said carrier strips between adjacent modules, each rung including collapsed means for holding the lead ends in the recesses.

7. An assembly as in claim 6 wherein said collapsed means comprises a pair of flat links each bent up from the rung and joining in an apex.

8. An assembly as in claim 7 wherein each apex includes a crimp joint securing said rungs in the collapsed position.

* * * * *